(12) United States Patent
Stroomer et al.

(10) Patent No.: US 7,003,751 B1
(45) Date of Patent: Feb. 21, 2006

(54) SPECIFICATION OF THE HIERARCHY, CONNECTIVITY, AND GRAPHICAL REPRESENTATION OF A CIRCUIT DESIGN

(75) Inventors: Jeffrey D. Stroomer, Lafayette, CO (US); Roger B. Milne, Boulder, CO (US); Jonathan B. Ballagh, Longmont, CO (US); Haibing Ma, Superior, CO (US); L. James Hwang, Menlo Park, CA (US); Nabeel Shirazi, San Jose, CA (US)

(73) Assignee: Xilinx Inc., San Jose, CA (US)

( * ) Notice: Subject to any disclaimer, the term of this patent is extended or adjusted under 35 U.S.C. 154(b) by 321 days.

(21) Appl. No.: 10/340,498

(22) Filed: Jan. 10, 2003

(51) Int. Cl.
*G06F 17/50* (2006.01)
(52) U.S. Cl. .............................. 716/11; 716/8; 345/661
(58) Field of Classification Search .............. 716/8–11; 345/661
See application file for complete search history.

(56) References Cited

U.S. PATENT DOCUMENTS

| | | | |
|---|---|---|---|
| 6,120,550 A * | 9/2000 | Southgate et al. ............ 716/11 |
| 6,223,327 B1 * | 4/2001 | Yamaji ........................... 716/5 |
| 6,230,307 B1 * | 5/2001 | Davis et al. ................... 716/16 |
| 6,292,925 B1 * | 9/2001 | Dellinger et al. .............. 716/8 |
| 6,430,732 B1 * | 8/2002 | Hwang et al. ................. 716/11 |
| 6,516,456 B1 * | 2/2003 | Garnett et al. ................. 716/8 |
| 6,588,004 B1 * | 7/2003 | Southgate et al. ............ 716/11 |
| 2001/0001881 A1 * | 5/2001 | Mohan et al. ................ 716/1 |
| 2004/0128638 A1 * | 7/2004 | Kerzman et al. ............. 716/11 |

OTHER PUBLICATIONS

Web printout; "Graphical Applications with Tcl and Tk"; available from http://www.pconline.com/~erc/tcl.htm; Jan. 6, 2003 2:17 pm; pp. 1-7.
Web printout; "[incr Tcl] more than chrome"; available from http://incrtcl.sourceforge.net/itcl/; Jan. 6, 2003 2:27 pm; pp. 1-2.
Peter Bellows and Brad Hutchings; "JHDL—An HDL for Reconfigurable Systems"; Department of Electrical and Computer Engineering, Brigham Young University; pp. 1-10.

* cited by examiner

*Primary Examiner*—Stacy A. Whitmore
(74) *Attorney, Agent, or Firm*—LeRoy D. Maunu

(57) ABSTRACT

Method and apparatus for creating a circuit design. An object-oriented program instantiates a plurality of objects that model a circuit design. The objects have hierarchy attributes, connectivity attributes, and display attributes that describe a plurality of modules. The hierarchy attributes define parent-child relationships between modules, the connectivity attributes define input-output connections between modules, and the display attributes define a layout of the modules for viewing. Each of the objects has an associated method for generating a design specification in a selected format. When the program is executed, the design specification is generated from the set of objects. Depending on the capabilities of the available tools, the modules and logic elements are displayed in accordance with the display attributes either from the object-oriented program or from the design specification.

23 Claims, 3 Drawing Sheets

SPECIFICATION OF THE HIERARCHY, CONNECTIVITY, AND GRAPHICAL REPRESENTATION OF A CIRCUIT DESIGN

FIELD OF THE INVENTION

The present invention relates to tools for developing circuit designs.

BACKGROUND

There are many software tools in which electronic designs can be built, debugged, and translated into hardware for field programmable gate arrays(FPGAs). Some, such as Altera's DSP Builder, Cadence's Signal Processing Worksystem, and Xilinx's System Generator for DSP, are high-level, abstract, visual environments. In these tools, flexible signal types, polymorphic blocks, automatic faithful generation of hardware, and straightforward analysis of results reduce the distance between algorithm and implementation, simplifying the job of the designer.

Ordinarily in such tools, a user assembles a design by hand, dragging blocks and connecting them with a mouse. Often this approach suitable, but there are circumstances when this approach is not. For example, designs sometimes contain thousands of blocks, and assembling by hand can be overwhelming. For some designs the collection of blocks or the ways in which blocks are connected need to change depending on the settings of parameters. It is also often desirable to use software to build designs. Finally, there though the number of blocks is large and connections are intricate.

A system and method that address the aforementioned problems, as well as other related problems, are therefore desirable.

SUMMARY OF THE INVENTION

The various embodiments of the invention support specification of the hierarchy, connectivity, and graphical display characteristics of a circuit design. An object-oriented program instantiates a plurality of objects that model a circuit design. The objects have hierarchy attributes, connectivity attributes, and display attributes that describe a plurality of modules. The hierarchy attributes define parent-child relationships between modules, the connectivity attributes define input-output connections between modules, and the display attributes define a layout of the modules for viewing. Each of the objects has an associated method for generating a design specification in a selected format. When the program is executed, the design specification is generated from the set of objects. Depending on the capabilities of the available tools, the modules and logic elements are displayed in accordance with the display attributes either from the object-oriented program or from the design specification.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

The various embodiments of the invention support design and implementation of circuit designs using object-oriented program code. A set of classes is provided for extension by an application program, with the instantiated objects modeling the hierarchy and connectivity of the design, along with graphics characteristics used in displaying blocks of the design. The design may be realized in a desired format, where the format depends on the design environment and target hardware.

Figure 1:
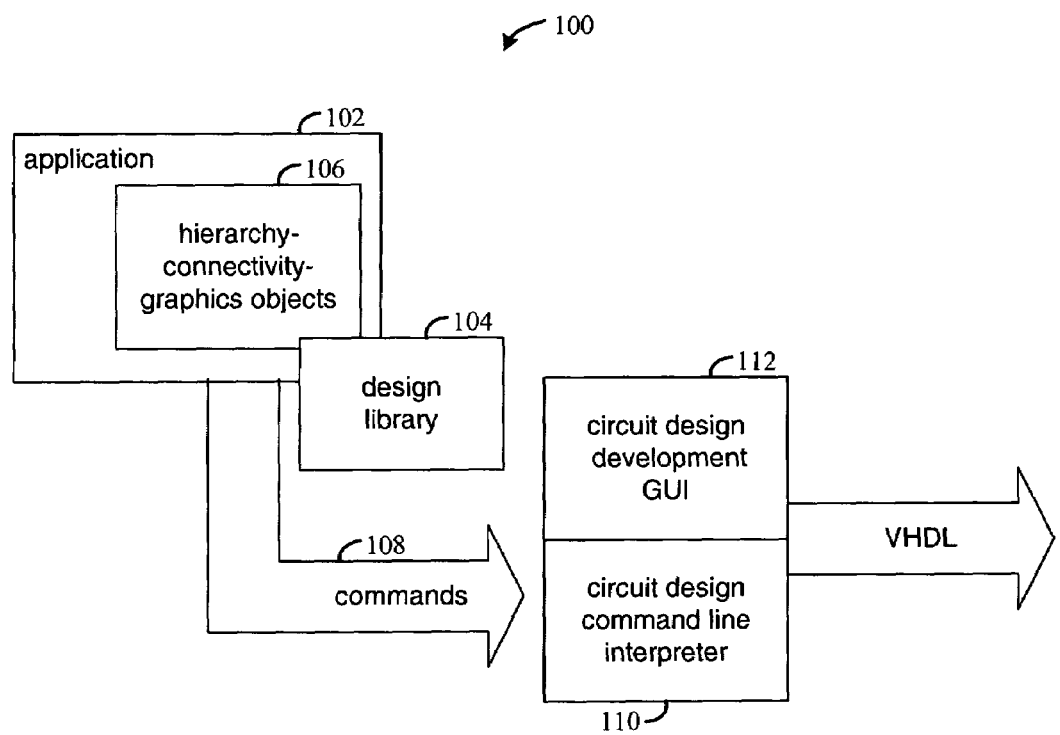
FIG. 1 is a functional block diagram of an arrangement for creating a circuit design in accordance with one embodiment of the invention.

FIG. 1 is a functional block diagram of an arrangement 100 for creating a circuit design in accordance with one embodiment of the invention. The functionality of the circuit design, along with display properties of the elements in the design, are specified in application program 102. In an example embodiment, program 102 is a Java application built from a set of classes, shown as design library 104, that allows specification of the blocks, hierarchy, and connections of a design. The objects of the application are shown as hierarchy-connectivity-graphics objects 106, hereinafter "design objects". The design objects automatically translate the description into a sequence of commands 108 that are executable by command line interpreter 110. A circuit design development GUI 112 runs in conjunction with the command line interpreter and supports visual editing of the design. Host computer systems that execute the software are not illustrated. However, those skilled in the art will recognize various alternative computing arrangements would be suitable for hosting the software.

In an example embodiment, command line interpreter 110 is software similar in function to MATLAB. MATLAB, which is produced by The Mathworks, Inc., is a command line interpreter that executes a proprietary language called .m code. The collection of mathematical functions available in .m code is broad, and as a result MATLAB is often used in developing digital signal processing applications. Simulink is a visual environment that runs in conjunction with MATLAB and is also supplied by The Mathworks. In Simulink, mathematical models are constructed by connecting blocks with signals in a way much like that used to build electronic designs in schematic editors.

System Generator (not shown) is a software tool from Xilinx that runs in Simulink. System Generator bridges the gap between Simulink and hardware. A Simulink mathematical model developed in System Generator can be translated automatically and faithfully into VHDL suitable for implementation in a Xilinx FPGA.

Figure 2:
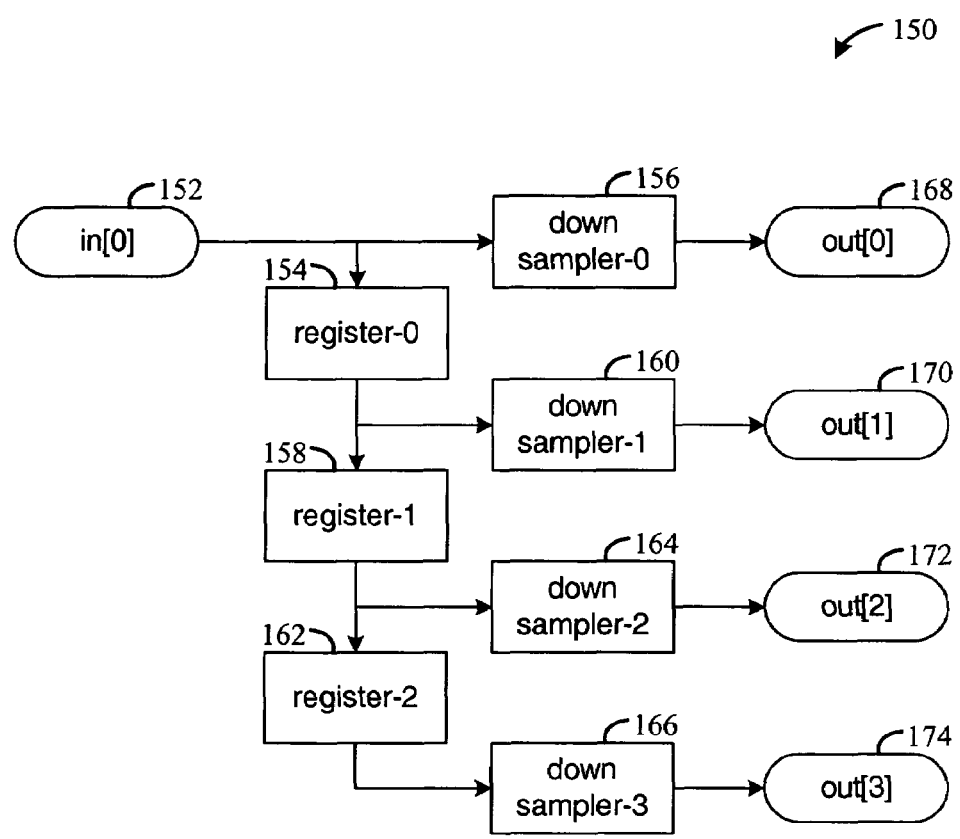
FIG. 2 is a functional block diagram of an example circuit of a type known as a "commutator"
Figure 3:
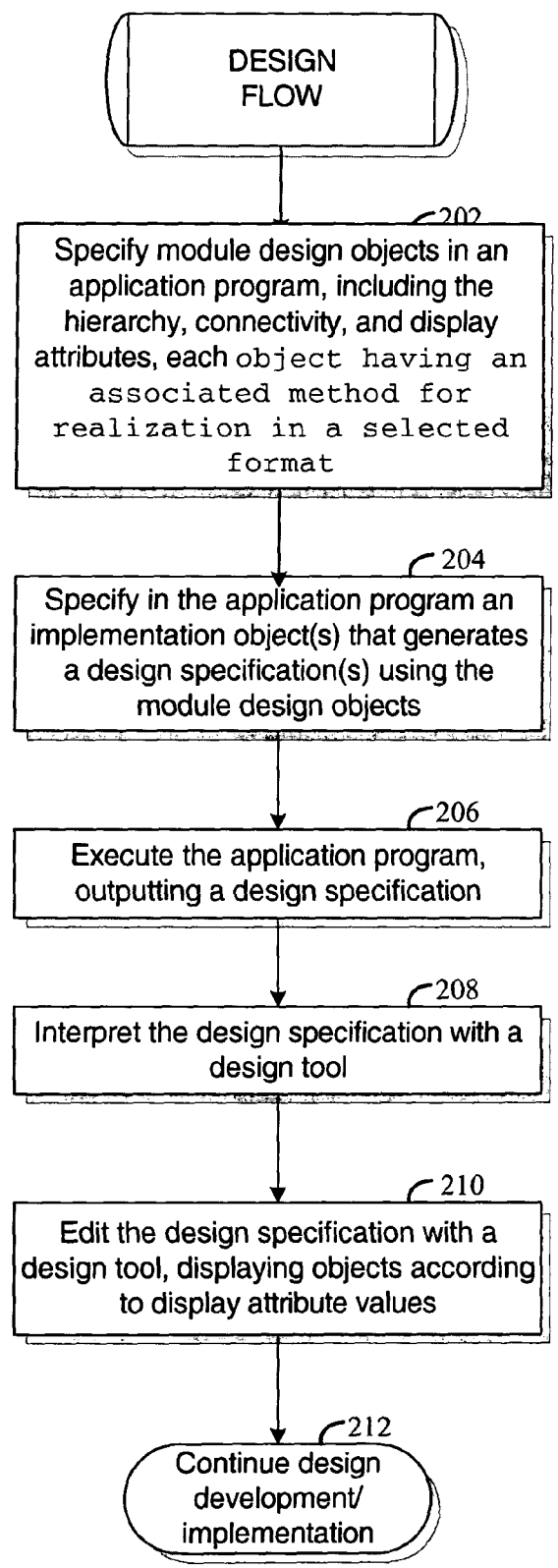
FIG. 3 is a flowchart that illustrates a process for creating a design in accordance with one embodiment of the invention.

FIG. 2 is a functional block diagram of an example commutator. The commutator is provided as an example of a circuit design that can be created via the present invention. The commutator is presented as an example of a simple design that is parameterizable and that needs both wiring and a graphical layout. Various embodiments of the invention are described with reference to FIGS. 2 and 3 along with example program code that implements the commutator. FIG. 3 is a flowchart that illustrates a process for creating a design in accordance with one embodiment of the invention.

A commutator is a circuit that divides a single high speed data stream into n slower data streams, each running at $(1/n)^{th}$ the speed of the original. The example commutator 150 includes input port in[0] (152), which feeds input sample data to register-0 (154) and down sampler-0 (156). A version of the input data stream with a delay of 1 is input to register-1 (158) and to down sampler-1 (160); a version of the input data stream with a delay of 2 is input to register-2 (162) and to down sampler-1 (164); and a version of the input data stream with a delay of 3 is input to down sampler-3 (166). The output data from the down samplers are provided to output ports out[0] (168), out[1] (170), out[2] (172), out[3] (174).

Before describing the example program code that implements the commutator, the types of objects that are available for creating a design are described. There are two types of objects: objects that model structure and connectivity, and objects that model graphics. Objects that model structure and connectivity include modules, ports, and nets. To use these objects, a Java application extends the class Module. Modules define the blocks and levels of circuit hierarchy, and ports and nets tell how modules are connected. In an example Simulink implementation, a module may be assigned its own schematic sheet. For one module that contains another module, the "containing" module is the parent, and the "contained" module is the child. A module that has no parent is a top-level module, and a module having no children is a leaf module. An intermediate module is neither a top-level module nor a leaf module.

Objects that handle graphics are frames. A frame represents a rectangle that describes where the graphics for a module should appear on a computer monitor. A frame may have absolute coordinates; however, more often a frame is a portion of some larger frame. In this case the position and size of the smaller frame are defined relative to the position and size of the larger one. Every module has at least one frame, but some have two. A module's upper frame describes the location of the graphics of the module in the frame of the module's parent. The lower frame is the graphical container in which the module's children are displayed. A leaf module has an upper frame but no lower frame. A top-level module has a lower frame but no upper frame. An intermediate module has both upper and lower frames, but the frames are only distinct provided the module gets its own schematic sheet.

The program code set forth below in Example 1 illustrates an application program that instantiates objects for implementing the commutator of FIG. 2. An example implementation of the classes referenced in the example program code is set forth in the appendices to this description. Appendix A has code that describes the class, Net; Appendix B has code that describes the class Module; Appendix C has code that describes the class Port; Appendix D has code that describes the class Frame; and Appendix E has code that describes the class Implementer.

```
public class Commutator extends Module {
    /**
     * Makes a new commutator.
     *
     * @param name    Tells name to assign to commutator.
     * @param n       Tells number of substreams into which main
     *                stream should be split.
     */
    public Commutator(String name, int n) {
        // Make this module a top level by giving it no parent.
        super(name, null, null, null);
        this.makeSchematicSheet( );
        // Make the top frame for the commutator.
        double w = 100;
```

-continued

```
        double h = 50;
        double [ ] nwc = { 0, 0, };
        double [ ] sec = { 4 * w, (2 * n - 1) * h, };
        Frame tf = new Frame(nwc, sec);
        this.setLowerFrame(tf);
        // Divide the frame into four vertical strips - one at the far
        // left for the in port, one at the left for the registers, one
        // at the right for the downsamplers, and one at the far right
        // for the out ports.
        Frame farLeft  = new Frame(tf, Frame.NW, 0.00, 0, 0.25, 1);
        Frame left     = new Frame(tf, Frame.NW, 0.25, 0, 0.25, 1);
        Frame right    = new Frame(tf, Frame.NW, 0.50, 0, 0.25, 1);
        Frame farRight = new Frame(tf, Frame.NW, 0.75, 0, 0.25, 1);
        // Make an in port and attach it to a net.
        Net inNet = new Net(this.getName( ) + "_net");
        h = 1.0 / (2.0 * n - 1.0);
        Frame f = new Frame(farLeft, Frame.NW, 0, 0, 1, h);
        Port inPort = in("in", inNet, f.fragment(0.60));
        // Make out ports and attach them to nets.
        double ypos = 0;
        Port [ ] outPorts = new Port [n];
        Net [ ] outNets = Net.newNets(n, this.getName( ) + "_net");
        for (int i = 0; i < n; i++) {
            f = new Frame(farRight, Frame.NE, 1, ypos, 1, h);
            outPorts[i] =
                out("out[" + i + "]", outNets[i], f.fragment(0.60));
            ypos += 2 * h;
        }
        // Make the registers and downsamplers in the center strips.
        ypos = 0;
        Net regIn = inNet;
        for (int i = 0; i < n; i++) {
            Frame dsFrame = new Frame(right, Frame.NE, 1, ypos, 1, h);
            new XlDsamp(this, n, regIn, outNets[i],
                    dsFrame.fragment(0.80));
            if (i != n - 1) {
                Frame regFrame =
                    new Frame(left, Frame.NW, 0, ypos + h, 1, h);
                Net regOut = new Net(this.getName( ) + "_reg" + i);
                Module r = new XlRegister(this, regIn, regOut,
                        regFrame.fragment(0.80));
                r.getSimulinkAttributes( ).put("Orientation", "down");
                regIn = regOut;
            }
            ypos += 2 * h;
        }
    }
}
```

EXAMPLE 1

The first line declares Commutator to be a class that extends the Module class. An application built using design library 104 generally contains one or several such classes. Instances of these classes become blocks and levels of hierarchy when the design is realized. The lines, super(name, null, null, null);
  this.makeSchematicSheet( );

make the new object a top-level object (step 202). The lines also indicate that in Simulink the object is to be given its own schematic sheet. The next few lines, double w=100;
  double h=50;
  double [ ] nwc={0, 0,};
  double [ ] sec={4*w, (2*n−1)*h,};
  Frame tf=new Frame(nwc, sec);
  this.setLowerFrame(tf);

build the lower frame for the top level, i.e., the frame that holds the body of the commutator (step 202). The frame is defined to be 4*w units wide and (2n−1) units high. The statements w=100 and h=50 denote, respectively, the width and height in pixels of a single block. Defining the size in this way makes the commutator scalable as n varies.

The lines,

```
Frame farLeft=new Frame(tf, Frame.NW, 0.00, 0, 0.25, 1);
Frame left=new Frame(tf, Frame.NW, 0.25, 0, 0.25, 1);
Frame right=new Frame(tf, Frame.NW, 0.50, 0, 0.25, 1);
Frame farRight=new Frame(tf, Frame.NW, 0.75, 0, 0.25, 1);
``` divide the top frame into four vertical strips of equal width—one at the far left for the input port 152, one at the left for the registers 154, 158, and 162, one at the right for the down samplers 156, 160, 164, and 166, and one at the far right for the output ports 168, 170, 172, and 174 (step 202). These constructor calls illustrate using relative position and size to locate small frames inside a large frame. In each line, the first parameter, tf, identifies the large frame. The second parameter, Frame.NW, specifies the corner of the small frame relative to which the other parameters are expressed (in this example, the northwest). Regardless of the absolute position and size of the large frame, the width and height are treated as relative, as are (x, y) coordinates within it. This means that the width and height are treated as though equal to 1, and coordinates range from 0 to 1, with x increasing from left to right and y increasing from top to bottom. The last two parameters specify the width and height of the small frame relative to the large frame. Thus, the width and height of each small frame are, respectively, one-fourth the width, and the full height of tf. The northwest corner of farLeft is located at position (0, 0) of tf. Similarly, the northwest corners of left, right, and farRight are at (0.25, 0), (0.50, 0), and (0.75, 0), respectively.

The lines,

```
Net inNet = new Net(this.getName( ) + "_net");
h = 1.0/(2.0 * n - 1.0);
Frame f = new Frame(farLeft, Frame.NW, 0, 0, 1, h);
Port inPort = in("in", inNet, f.fragment(0.60));
``` create the input port, position the input port at the top of the farLeft frame and attach the input port to a net (step 202). The frame for the port is {f.fragment(0.60)}, indicating the port occupies the middle 60% of frame f.

The lines

```
double ypos = 0;
Port [ ] outPorts = new Port [n];
Net [ ] outNets = Net.newNets(n, this.getName( ) + "_net");
for (int i = 0; i < n; i++) {
    f = new Frame(farRight, Frame.NE, 1, ypos, 1, h);
    outPorts[i] =
        out("out[" + i + "]", outNets[i], f.fragment(0.60));
    ypos += 2 * h;
}
``` create n output ports, position each port in the farRight frame, and attach each output port to a net (step 202).

The lines

```
ypos = 0;
Net regIn = inNet;
```

```
for (int i = 0; i < n; i++) {
    Frame dsFrame = new Frame(right, Frame.NE, 1, ypos, 1, h);
    new XlDsamp(this, n, regIn, outNets[i],
            dsFrame.fragment(0.80));
    if (i != n - 1) {
        Frame regFrame =
            new Frame(left, Frame.NW, 0, ypos + h, 1, h);
        Net regOut = new Net(this.getName( ) + "_reg" + i);
        Module r = new XltRegister(this, regIn, regOut,
                    regFrame.fragment(0.80));
        r.getSimulinkAttributes( ).put("Orientation", "down");
        regIn = regOut;
    }
    ypos += 2 * h;
}
``` make, position, and wire the downsamplers and registers (step 202). Modules XlDsamp and XlRegister are predefined in the design library 106 because the downsampler and register are library elements in System Generator. Parameters this, n, regIn, outNets[i], and dsFrame.fragment(0.80) in the XlDsamp constructor specify, respectively, the parent module, rate, input net, output net, and upper frame for the $i^{th}$ downsampler. The parameters to the register are similar.

The line r.getSimulinkAttributes( ).put("Orientation", "down");

accesses the register's Simulink block key/values directly to force the input and output ports to appear on top and bottom.

Example code that creates a new commutator and generates the .m code to realize the commutator within System Generator (step 204) is as follows:

```
public class Main {
    public static void main(String [ ] args) {
        Utility.assert_(args.length == 1,
                "expected command line to specify size of commutator");
        Module c = new Commutator("commutator_" + args[0],
                    new Integer(args[0]).intValue( ));
        System.out.print(new Implementer( ).implement(c));
    }
}
```

An Implementer is an object that transforms the design into .m instructions. In this example the instructions are written to the console.

Execution of the program results in generation of a design specification in a selected format (step 206). For example, in the embodiment of FIG. 1, the design specification generated by the application is .m code for input to MATLAB. The design specification is interpreted (step 208) by a tool such as MATLAB, and the design is further edited (step 210) via a tool such as Simulink. In conjunction with further design tools, such as System Generator, the circuit design may be further refined, and an implementation generated for a particular technology (e.g., a CMOS ASIC) or a particular programmable logic device (e.g., an FPGA).

The present invention is believed to be applicable to a variety of systems for creating circuit designs for different circuit technologies and has been found to be particularly applicable and beneficial in developing circuit designs for FPGAs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

APPENDIX A

```
package com.xilinx.jg;
import java.lang.*;
import java.util.*;
/**
 * A Net is the jg object that represents a net in a netlist.
 */
public class Net {
    String name;
        // Tells this net's name.
    static Hashtable nets = new Hashtable( );
        // Maps each net name to the corresponding net.
    Hashtable attributes = new Hashtable( );
        // Tells the attributes for this net. Attributes are key/a-value
        // pairs. A key is a String. An a-value is one of the following:
        // String, Integer, Double, Vector of a-values, or Hashtable
        // whose keys are Strings and values are a-values.
    public static Net fakeDriver = new Net("fakeDriver");
        // Used to drive in-ports for which it is acceptable not to have a driver.
    //**
     * Makes a new net.
     *
     * @param name Name the net should have.
     */
    public Net(String name) {
        this.name = Utility.newName(name, nets);;
        nets.put(this.name, this);
    }
    /**
     * Returns this net's name.
     *
     * @return Name of this net.
     */
    public String getName( ) {
        return name;
    }
    /**
     * Returns the set of attributes for this net.
     *
     * @return Set of attributes for this module.
     */
    public Hashtable getAttributes( ) {
        return attributes;
    }
    /**
     * Returns an array of new nets.
     *
     * @param n Tells now many nets to make.
     * @param name Tells prefix to use to form net names.
     *
     * @return Array of new nets.
     */
    public static Net [ ] newNets(int n, String name) {
        Net [ ] nets = new Net[n];
        for (int i = 0; i < n; i++) nets[i] = new Net(name);
        return nets;
    }
    /**
     * Returns a slice of an array of nets.
     *
     * @param n       Array from which slice should be extracted.
     * @param start   Tells where slice starts.
     * @param end     Tells where slice ends.
     *
     * @return        Array slice.
     */
    public static Net [ ] slice(Net [ ] n, int start, int end) {
        Net [ ] ns = new Net [end − start + 1];
        int j = −1;
        for (int i = start; i <= end; i++) {
            j++;
            ns[j] = n[i];
        }
        return ns;
    }
}
```

APPENDIX A-continued

```
}
```

APPENDIX B

```
package com.xilinx.jg;
import java.lang.*;
import java.util.*;
/**
 * A Module is the jg object that represents a block in a netlist. It is
 * the equivalent of a Verilog module or a VHDL entity/architecture pair.
 * Modules contain submodules, nets, and ports.
 */
public class Module {
    String name;
        // Tells the name of this module.
    Module parent;
        // Tells what module owns this module. (Null if this is a top level.)
    Module topLevel;
        // Tells what module is the top level for the design that contains this
        // module.
    boolean getsSchemSheet = false;
        // Tells whether this module should get its own Simulink schematic sheet.
    boolean isLeaf;
        // Tells whether this module is a leaf.
    Hashtable ports = new Hashtable( );
        // Tells the ports that connect this module to the outside world.
    int nrInPorts = 0;
        // Tells the number of in ports for this module.
    int nrOutPorts = 0;
        // Tells the number of out ports for this module.
    Vector lines = new Vector( );
        // Tells the lines inside this module.
    Hashtable submodules = new Hashtable( );
        // Tells the submodules this module contains.
    Hashtable attributes = new Hashtable( );
        // Tells the attributes for this module. Attributes are key/a-value
        // pairs. A key is a String. An a-value is one of the following:
        // String, Integer, Double, Vector of a-values, or Hashtable
        // whose keys are Strings and values are a-values.
    Frame upperFrame;
        // Tells the upper frame for this module, i.e., the frame this
        // module occupies in the frame of its parent module. There is no upper frame
        // for a top level module.
    Frame lowerFrame;
        // Tells the frame that holds the children of this module. There is
        // no lower frame for a leaf module. The upper and lower frame coincide
        // when the module does not get a Simulink schematic sheet.
    Hashtable simulinkAttributes = new Hashtable( );
        // Tells the Simulink attributes for this module. Key/values are
        // translated directly into ordinary Simulink block attributes.
    Hashtable modules;
        // Tells what modules have been declared for the design that
        // contains this module.
    /**
     * Makes a new module.
     *
     * @param name Name the module should have.
     * @param parent Module that contains this module (or null if this module
     *        is a top level).
     * @param upperFrame Frame the new module occupies in the lower frame of its
     *        parent module. (Not needed if the new module is a top level.)
     * @param lowerFrame Frame containing the upper frames of this
     *        module's children. (Not needed if the new module is a leaf.)
     */
    public Module(String name,
                  Module parent,
                  Frame upperFrame,
                  Frame lowerFrame) {
```

APPENDIX B-continued

```
        this.parent = parent;
        this.upperFrame = upperFrame;
        this.lowerFrame = lowerFrame;
        if (parent != null) {
            modules = parent.getModules( );
            name = Utility.newName(name, modules);
            parent.getSubmodules( ).put(name, this);
            topLevel = parent.getTopLevel( );
        }
        else {
            modules = new Hashtable( );
            topLevel = this;
            getsSchemSheet = true;
        }
        this.name = name;
        modules.put(name, this);
    }
    /**
     * Makes a new module. The module is assigned a default name.
     *
     * @param parent Module that contains this module (or null if this module
     *     is a top level).
     * @param upperFrame the new module occupies in the lower frame
     *     of its parent module.
     * @param lowerFrame Frame containing the upper frames of this
     *     module's children.
     */
    public Module(Module parent,
                    Frame upperFrame,
                    Frame lowerFrame) {
        this ("module", parent, upperFrame, lowerFrame);
    }
    /**
     * Returns the set of all modules.
     *
     * @return Set of all modules.
     */
    public Hashtable getModules( ) {
        return modules;
    }
    /**
     * Returns the top level module.
     *
     * @return Top level module.
     */
    public Module getTopLevel( ) {
        return topLevel;
    }
    /**
     * Returns true (false) if this is (is not) a top level.
     *
     * @return true (false) if this module is (is not) a top level.
     */
    public boolean isTopLevel( ) {
        return parent == null;
    }
    /**
     * Returns the name of this module.
     *
     * @return Name of this module.
     */
    public String getName( ) {
        return name;
    }
    /**
* Returns the hierarchical name of this module.
     *
     * @return Hierarchical name of this module.
     */
    public String getHierarchicalName( ) {
        if (parent == null) return name;
        if (getsSchematicSheet( ) || isLeaf( ))
            return parent.getHierarchicalName( ) + "/" + name;
        else
            return parent.getHierarchicalName( );
    }
    /**
     * Returns the module that owns this module.
     *
     * @return Module that owns this module.
     */
    public Module getParent( ) {
        return parent;
    }
    /**
     * Returns the set of ports for this module.
     *
     * @return Set of ports for this module.
     */
    public Hashtable getPorts( ) {
        return ports;
    }
    /**
     * Returns the set of lines for this module.
     *
     * @return Set of lines for this module.
     */
    public Vector getLines( ) (
        return lines;
    }
    /**
     * Returns the set of submodules for this module.
     *
     * @return Set of submodules for this module.
     */
    public Hashtable getSubmodules( ) {
        return submodules;
    }
    /**
     * Returns the set of attributes for this module.
     *
     * @return Set of attributes for this module.
     */
    public Hashtable getAttributes( ) {
        return attributes;
    }
    /**
     * Returns the set of Simulink attributes for this module.
     *
     * @return Set of Simulink attributes for this module.
     */
    public Hashtable getSimulinkAttributes( ) {
        return simulinkAttributes;
    }
    /**
     * Returns the upper frame for this module.
     *
     * @return Upper frame for this module.
     */
    public Frame getUpperFrame( ) {
        return upperFrame;
    }
    /**
     * Assigns a given frame as the upper frame for this module.
     *
     * @param frame Frame to use as the upper frame for this module.
     */
    public void setUpperFrame(Frame frame) {
        this.upperFrame = frame;
    }
    /**
     * Returns the lower frame for this module.
     *
     * @return Lower frame for this module.
     */
    public Frame getLowerFrame( ) {
        return lowerFrame;
    }
    /**
     * Assigns a given frame as the lower frame for this module.
     *
     * @param lowerFrame Lower frame for this module.
     */
    public void setLowerFrame(Frame frame) (
        this.lowerFrame = frame;
    }
    /**
```

APPENDIX B-continued

```
 * Returns true (false) if this module should (should not) get its own
 * Simulink schematic sheet.
 *
 * @return true (false) if this module should (should not) get its own
 *         Simulink schematic sheet.
 */
public boolean getsSchematicSheet( ) {
    return getsSchemSheet;
}
/**
 * Tags this module as needing a Simulink schematic sheet.
 */
public void makeSchematicSheet( ) {
    getsSchemSheet = true;
}
/**
 * Returns true (false) if this module is (is not) a leaf.
 *
 * @return true (false) if this module is (is not) a leaf.
 */
public boolean isLeaf( ) {
    return isLeaf;
}
/**
 * Tags this module as a leaf.
 */
public void tagAsLeaf( ) {
    isLeaf = true;
    getsSchemSheet = false;
}
/**
 * Makes a new in-port inside this module.
 *
 * @param name Name the port should have.
 * @param net Net to which the port should be connected.
 * @param frame Frame for the new port.
 *
 * @return New in-port.
 */
public Port in(String name, Net net, Frame frame) {
    nrInPorts++;
    Port p = new Port(name, this, Port.IN, nrInPorts, net, frame);
    ports.put(name, p);
    return p;
}
/**
 * Makes a new in-port inside this module. The port is given a default
name.
 *
 * @param net Net to which the port should be connected.
 * @param frame Upper frame for the new port.
 *
 * @return New in-port.
 */
public Port in(Net net, Frame frame) {
    String name Utility.newName(Port.IN, ports);
    return in(name, net, frame);
}
/**
 * Makes a new out-port inside this module.
 *
 * @param name Name the port should have.
 * @param net Net to which the port should be connected.
 * @param frame Upper frame for the new port.
 *
 * @return New out-port.
 */
public Port out(String name, Net net, Frame frame) {
    nrOutPorts ++;
    Port p = new Port(name, this, Port.OUT, nrOutPorts, net,
    frame);
    ports.put(name, p);
    return p;
}
/**
 * Makes a new out-port inside this module. The port is given a
default name.
 *
 * @param net Net to which the port should be connected.
```

APPENDIX B-continued

```
 * @param frame Frame for the new port.
 *
 * @return New out-port.
 */
public Port out(Net net, Frame frame) {
    String name = Utility.newName(Port.OUT, ports);
    return out(name, net, frame);
}
/**
 * Finds the lines for every module in the design that contains this
module.
 */
public void findAllLines( ) {
    for (Enumeration e = modules.elements( );
    e.hasMoreElements( );) {
        Module m = (Module)e.nextElement( );
        m.findLines( );
    }
}
/**
 * Returns a hash set whose elements are the ports that are relevant
when
 * constructing lines for this module. The relevant ports are the
following:
 *    1) The ports on this module, and
 *    2) The ports on any submodule which is a leaf or a level of
hierarchy.
 */
HashSet findRelevantPorts( ) {
    HashSet relevantPorts = new HashSet(ports.values( ));
    for (Enumeration e = submodules.elements( );
    e.hasMoreElements( );) {
        Module m = (Module)e.nextElement( );
        if (m.getsSchematicSheet( ) || m.isLeaf( ))
            relevantports.addAll(m.getPorts( ).values( ));
        else
            relevantPorts.addAll(m.findRelevantports( ));
    }
    return relevantPorts;
}
/**
 * Finds the lines in this module.
 */
public void findLines( ) {
    // If this module does not get a schematic sheet, then return
without doing
    // anything.
    if (! getsSchematicSheet( )) return;
    // Find ports that are relevant for constructing lines for this
module.
    HashSet relevantPorts = findRelevantPorts( );
    // Build hash tables telling drivers and loads for each net that is
    // attached to a relevant port.
    HashSet nets = new HashSet( );
    Hashtable netToDrivers = new Hashtable( );
    Hashtable netToLoads = new Hashtable( );
    for (Iterator i = relevantPorts.iterator( ); i.hasNext( );) {
        Port p = (Port)i.next( );
        Net n = p.getNet( );
        if (n == null) continue;
        Hashtable ht = p.isDriver(this)? netToDrivers : netToLoads;
        Hashset ps = (HashSet)ht.get(n);
        if (ps == null) {
            ps = new HashSet( );
            ht.put(n, ps);
        }
        ps.add(p);
        nets.add(n);
    }
    // Discard nets that have no loads, then complain about the
    // remaining ones that do not have exactly one driver.
    HashSet nets1 = new HashSet(nets);
    for (Iterator i = nets1.iterator( ); i.hasNext( );) {
        Net n = (Net)i.next( );
        HashSet drivers = (HashSet)netToDrivers.get (n);
        HashSet loads = (HashSet)netToLoads.get(n);
        if (loads == null || n == Net.fakeDriver) {
            nets.remove(n);
            continue;
        }
```

APPENDIX B-continued

```
        Utility.assert_(drivers != null,
            "net " + n.getName( ) + " in module " + name + " has
            no driver");
        Utility.assert_(drivers.size( ) == 1, "net " + n.getName( ) +
            " in module " + name + " has multiple drivers ");
    }
    // For each remaining net, build lines that connect the driver to
the loads.
    // Note that when the driver and load are in the same submodule, we
    // allow the submodule to build the line.
    for (Iterator i = nets.iterator( ); i.hasNext( );) {
        Net n = (Net)i.next( );
        HashSet drivers = (HashSet)netToDrivers.get(n);
        HashSet loads = (HashSet)netToLoads.get(n);
        for (Iterator i1 = drivers.iterator( ); i1.hasNext( );) {
            Port driver = (Port)i1.next( );
            for (Iterator i2 = loads.iterator( ); i2.hasNext( );) {
                Port load = (Port)i2.next( );
                if (driver.getParent( ) != load.getParent( ))
                    lines .addElement(new Line(driver, load));
            }
        }
    }
}
```

APPENDIX C

```
package com.xilinx.jg;
import java.lang.*;
import java.util.*;
/**
 * A Port is the jg object that represents a port in a netlist.
 */
public class Port {
    String name;
        // Tells this port's name.
    Module parent;
        // Tells what module owns this port.
    String direction;
        // Tells this port's direction.
    int index;
        // Tells this port's index (= position in the port declaration list).
        // This is needed to simplify the creation of Simulink lines.
    Net net;
        // Tells the net attached to this port.
    Frame frame;
        // Tells the frame this port occupies in its parent module.
    Hashtable attributes = new Hashtable( );
        // Tells the attributes for this port. Attributes are key/a-value
        // pairs. A key is a String. An a-value is one of the following:
        // String, Integer, Double, Vector of a-values, or Hashtable
        // whose keys are Strings and values are a-values.
    Hashtable simulinkAttributes = new Hashtable( );
        // Tells the Simulink attributes for this module. Key/values are
        // translated directly into ordinary Simulink block attributes.
    // Directions for ports.
    public final static String IN = "in";
    public final static String OUT = "out";
    /**
     * Makes a new port.
     *
     * @param name Name the port should have.
     * @param parent Module that contains this port.
     * @param direction Tells this port's direction.
     * @param index Tells this port's index.
     * @param net Tells the net to which this port is attached.
     * @param frame Frame this port occupies in its parent module.
     */
    public Port(String name,
                Module parent,
                String direction,
                int index,
                Net net,
                Frame frame) {
        Utility.assert_(name != null, "expected port name to be non-null");
```

APPENDIX C-continued

```
        this.name = name;
        Utility.assert_(parent != null, "expected port parent to be non-
null");
        this.parent = parent;
        Utility.assert_(direction.equals(Port.IN) ||
direction.equals(Port.OUT),
            "expected port direction to be " + Port.IN + " or " + Port.OUT);
        Utility.assert_(! direction.equals(Port.IN) net || net != null,
            "trying to build an in port with no driver");
        this.direction = direction;
        this.index = index;
        this.net = net;
        this.frame = frame;
    }
    /**
     * Returns this port's name.
     *
     * @return Name of this port.
     */
    public String getName( ) {
        return name;
    }
    /**
     * Returns the module that owns this port.
     *
     * @return Module that owns this port.
     */
    public Module getParent( ) {
        return parent;
    }
    /**
     * Returns the frame for this port.
     *
     * @return Frame for this port.
     */
    public Frame getFrame( ) {
        return frame;
    }
    /**
     * Returns this port's direction.
     *
     * @return Direction of this port.
     */
    public String getDirection( ) {
        return direction;
    }
    /**
     * Returns this port's index.
     *
     * @return Index of this port.
     */
    public int getIndex( ) {
        return index;
    }
    /**
     * Sets this port's index.
     *
     * @param Index to assign to this port.
     */
    public void setIndex(int index) {
        this.index = index;
    }
    /**
     * Returns the net attached to this port.
     *
     * @return Net attached to this port.
     */
    public Net getNet( ) {
        return net;
```

APPENDIX C-continued

```
}
/**
 * Returns the frame for this port.
 *
 * @return Frame for this port.
 */
public Frame getPort( ) {
    return frame;
}
/**
 * Returns the set of attributes for this module.
 *
 * @return Set of attributes for this module.
 */
public Hashtable getAttributes( ) {
    return attributes;
}
/**
 * Returns true (false) if this port is (is not) a driver in a given
module.
 * Note: This port must belong to the given module or to one of its
 * (not necessarily immediate) submodules.
 *
 * @param m Module in which to perform test.
 *
 * @return true (false) if this port is (is not) a driver in
<tt>m</tt>.
 */
public boolean isDriver(Module m) {
    return (parent == m && direction.equals(Port.IN)) ||
        (parent != m && direction.equals(Port.OUT));
}
/**
 * Returns the Simulink name, with respect to a given module, of this
port.
 * Note: This port must belong to the given module or to one of its
 * immediate submodules.
 *
 * @param m Module with respect to which the port Simulink
name should be
 *          built.
 *
 * @return Simulink name of this port with respect to <tt>m</tt>.
 */
public String getSimulinkName(Module m) {
    if (m == parent) return name + "/1";
    return parent.getName( ) + "/" + index;
}
}
```

APPENDIX D

```
package com.xilinx.jg;
import java.lang.*;
import java.util.*;
/**
 * A Frame is a jg object that represents a graphics rectangle. It tells
 * how the graphics for a module should be positioned on the screen.
Frames
 * are very much like Tk frames (hence the name).
 */
public class Frame {
    Frame parent;
        // Tells what frame contains this frame. (Null if this is a top
frame.)
    String anchor;
        // Tells the anchor point for this frame.
    double relX;
        // Tells the x-coordinate within the parent frame of the anchor point
for
        // this frame. The x-coordinate is specified in relative terms: 0.0
(1.0)
        // corresponds to the left (right) edge of the parent frame.
    double relY;
        // Tells the y-coordinate within the parent frame of the anchor point
for
        // this frame. The y-coordinate is specified in relative terms: 0.0
(1.0)
        // corresponds to the top (bottom) edge of the parent frame.
    double relWidth;
        // Tells the width of this frame in its parent frame. The width is
        // specified in relative terms: 0.5 means the frame will be half as
wide
        // as its parent, 1.0 means it will have the same width as its
parent,
        // and so on.
    double relHeight;
        // Tells the height of this frame in its parent frame. The height is
```

APPENDIX D-continued

```
        // specified in relative terms: 0.5 means the frame will be half as
high
        // as its parent, 1.0 means it will have the same height as its
parent,
        // and so on.
     boolean absoluteCoordsKnown;
        // True (false) if the absolute coordinates for this frame are (are
not)
        // known. Absolute coordinates are the raw values that are used in
        // Simulink to locate the northwest and southeast corners of a block.
     double [ ] absoluteNwCorner = new double [2];
        // Tells the absolute northwest corner of this frame.
     double [ ] absoluteSeCorner = new double [2];
        // Tells the absolute northwest corner of this frame.
     public static int X = 0;
        // Constant denoting x-coordinates.
     public static int Y = 1;
        // Constant denoting y-coordinates.
     public final static String NE = "ne";
     public final static String SE = "se";
     public final static String NW = "nw";
     public final static String SW = "sw";
        /**
         * Makes a new frame.
         *
         * @param parent Frame that contains this module (or null if this frame
         *    is a top level).
         * @param anchor Anchor point for this frame.
         * @param relX Tells the x-coordinate within the parent frame of the
         *    anchor point for this frame. The x-coordinate is relative:
0.0
         *    (1.0) corresponds to the left (right) edge of the parent
frame.
         *    Note: This is only meaningful when the new frame has a
parent.
         * @param relY Tells the y-coordinate within the parent frame of the
         *    anchor point for this frame. The y-coordinate is relative:
         *    0.0 (1.0) corresponds to the top (bottom) edge of the parent
         *    frame. Note: This is only meaningful when the new frame
         *    has a parent.
         * @param relWidth Tells the width of this frame in its parent frame.
The
         *    width is relative: 0.5 means the frame will be half as wide
as its
         *    parent, 1.0 means it will have the same width, and so on.
Note:
         *    This is only meaningful when the new frame has a parent.
         * @param relHeight Tells the height of this frame in its parent frame.
The
         *    height is relative: 0.5 means the frame will be half as high
as
         *    its parent, 1.0 means it will have the same height, and so
on.
         *    Note: This is only meaningful when the new frame has a
parent.
         */
     public Frame(Frame parent,
                  String anchor,
                  double relX,
                  double relY,
                  double relWidth,
                  double relHeight) {
        this.parent = parent;
        this.anchor = anchor;
        this.relX = relX;
        this.relY = relY;
        this.relWidth = relWidth;
        this.relHeight = relHeight;
        absoluteCoordsKnown = false;
     }
        /**
         * Makes a new top-level frame having given northwest and southeast
corners.
         *
         * @param nwc Northwest corner for the frame.
         * @param sec Southeast corner for the frame.
         */
     public Frame(double [ ] nwc, double [ ] sec) {
     this(null, null, -1, -1, -1, -1);
```

APPENDIX D-continued

```
        absoluteNwCorner[X] = nwc[X];
        absoluteNwCorner[Y] = nwc[Y];
        absoluteSeCorner[X] = sec[X];
        absoluteSeCorner[Y] = sec[Y];
        Utility.assert_(isNorthwestOf(absoluteNwCorner, absoluteSeCorner),
            "nw corner " + toString(absoluteNwCorner) + " is not northwest of "
            + "se corner " + toString(absoluteSeCorner));
        absoluteCoordsKnown = true;
    }
    /**
     * Returns a new frame that is a fragment of this frame. The new frame is
     * centered in this frame. Its width and height are p times the width and
     * height of this frame, where p is a given value.
     *
     * @param p Tells value to multiply the width and height of this frame by to
     *          obtain the width and height of the fragment.
     */
    public Frame fragment(double p) {
        double r = (1.0 - p) / 2;
        return new Frame(this, NW, r, r, p, p);
    }
    /**
     * Returns the absolute northwest corner for this frame.
     *
     * @return Absolute northwest corner for this frame.
     */
    public double [ ] getAbsoluteNwCorner( ) {
        if (! absoluteCoordsKnown) findAbsoluteCoords( );
        return absoluteNwCorner;
    }
    /**
     * Returns the absolute southeast corner for this frame.
     *
     * @return Absolute southeast corner for this frame.
     */
    public double [ ] getAbsoluteSeCorner( ) {
        if (! absoluteCoordsKnown) findAbsoluteCoords( );
        return absoluteSeCorner;
    }
    /**
     * Returns true (false) if one corner is northwest of a second.
     *
     * @param nw Putative northwest corner.
     * @param se Putative southeast corner.
     *
     * @return true (false) if <tt>nw</tt>is (is not) northwest if <tt>se</tt>.
     */
    boolean isNorthwestOf(double [ ] nw, double [ ] se) {
        return nw[X] <= se[X] && nw[Y] <= se[Y];
    }
    /**
     * Finds the absolute coordiates for the northwest and southeast corners of
     * this frame.
     */
    void findAbsoluteCoords( ) {
        // If this frame has no parent, use absolute corners specified in the
        // constructor. Otherwise, calculate the absolute corners from those for
        // the parent.
        if (parent != null) {
            double [ ] pnw = parent.getAbsoluteNwCorner( );
            double [ ] pse = parent.getAbsoluteSeCorner( );
            double pWidth = pse[X] - pnw[X];
            double pHeight = pse[Y] - pnw[Y];
            double myWidth = pWidth * relWidth;
            double myHeight = pHeight * relHeight;
            double xOffset = pWidth * relX;
            double yOffset = pHeight * relY;
            if (anchor.equals(NW)) {
                absoluteNwCorner[X] = xOffset + pnw[X];
                absolutewwCorner[Y] = yOffset + pnw[Y];
            }
            else if (anchor.equals(NE)) {
```

APPENDIX D-continued

```
                absoluteNwCorner[X] = xOffset + pnw[X] - myWidth;
                absoluteNwCorner[Y] = yOff set + pnw[Y];
            }
            else if (anchor.equals(SW)) {
                absoluteNwCorner[X] = xOffset + pnw[X];
                absoluteNwCorner[Y] = yOffset + pnw[Y] - myHeight;
            }
            else if (anchor.equals(SE)) {
                absoluteNwCorner[X] = xOffset + pnw[X] - myWidth;
                absoluteNwCorner[Y] = yOffset + pnw[Y] - myHeight;
            }
            else
                Utility.assert_(false, "bad value for anchor");
            absoluteSeCorner[X] = absoluteNwCorner[X] + myWidth;
            absoluteSeCorner[Y] = absoluteNwCorner[Y] + myHeight;
        }
        Utility.assert_(isNorthwestOf(absoluteNwCorner, absoluteSeCorner),
            "nw corner " + toString(absoluteNwCorner) + " is not northwest of "
+
            "se corner " + toString(absoluteSeCorner));
            absoluteCoordsKnown = true;
    }
    /**
     * Returns a string that represents a pair of coordinates.
     *
     * @param coords Pair of coordinates to be represented as a string.
     *
     * @return String representing <tt>coords</tt>.
     */
    public static String toString(double [ ] coords) {
        return "(" + coords[X] + "," + coords[Y] + ")";
    }
}
```

APPENDIX E

```
package com.xilinx.jg;
import java.lang.*;
import java.util.*;
/**
 * An Implementer translates a netlist represented as a tree of jg
Modules
 * into an equivalent Sysgen/Simulink design.
 */
public class Implementer {
    HashSet openLibraries = new HashSet( );
            // Keeps track of which libraries have already been opened.
    final static String CR = "\n";
    /**
     * Transforms a jg design into a sequence of .m instructions that
realize
     * the design as a Sysgen/Simulink netlist.
     *
     * @param topModule Top level module for the design to be implemented.
     *
     * @return String of .m instructions that realize the design as a
     *              Sysgen/Simulink netlist.
     */
    public String implement (Module topModule) {
        Utility.assert_(topModule.isTopLevel( )
            topModule.getName( ) + " is not a top level");
        // Step through data structures to prepare for .m code generation.
        topModule.findAllLines( );
        // Build .m instructions to make blocks.
        StringBuffer b = new StringBuffer( );
        b.append(CR + "% Create Sysgen/Simulink library blocks and
subsystems");
        b.append(addBlocks(topModule));
        // Print .m instructions to make ports.
        b.append(CR);
        b.append(CR + "% Create ports");
        b.append(addPorts(topModule));
        // Close all open libraries.
        b.append(CR);
        b.append(CR + "% Close all open libraries");
        for (Iterator i = openLibraries.iterator( ); i.hasNext( );) {
```

APPENDIX E-continued

```
            String libName = (String)i.next( );
            if (libName.lastIndexOf("/") == -1)
                b.append(CR + "close_system('" + libName + "');");
        }
        openLibraries.clear( );
        // Print .m instructions to make lines.
        b.append(CR);
        b.append(CR + "% Create lines");
        b.append(addLines(topModule));
        b.append(CR);
        return b.toString( );
    }
    /**
     * Returns a hash table of key/values describing a given port.
     *
     * @param p Port whose key/values should be constructed.
     *
     * @return Hash table of key/values describing <tt>p</tt>.
     */
    Hashtable buildPortSettings(Port p) {
        // Calculate Simulink's idea of where this port should be located, and
        // save it in the "position" key/value in the "matlab_params" hash table.
        Hashtable h = new Hashtable( );
        Hashtable mp = new Hashtable( );
        double [ ] nw = p.getFrame( ).getAbsoluteNwCorner( );
        double [ ] se = p.getFrame( ).getAbsoluteSeCorner( );
        int nwX = (new Double(nw[Frame.X] + 0.5)).intValue( );
        int nwY = (new Double(nw[Frame.Y] + 0.5)).intValue( );
        int seX = (new Double(se[Frame.X] + 0.5)).intValue( );
        int seY = (new Double(se[Frame.Y] + 0.5)).intValue( );
        String pos = "[" + nwX + " " + nwY + " " + seX + " " + seY + "]";
        mp.put(Attribute.POSITION, pos);
        h.put(Attribute.MATLAB_PARAMS, mp);
        return h;
    }
    /**
     * Returns a hash table of key/values describing a given module.
     *
     * @param m Module whose key/values should be constructed.
     *
     * @return Hash table of key/values describing <tt>m</tt>.
     */
    Hashtable buildModuleSettings(Module m) {
        // Blindly copy ordinary attributes from m into new hash table h.
        Hashtable a = m.getAttributes( );
        Hashtable h = new Hashtable(m.getAttributes( ));
        // Add a "matlab_params" hash table to h is there is not one already.
        Hashtable mp = (Hashtable)h.get(Attribute.MATLAB_PARAMS);
        if (mp == null) {
            mp = new Hashtable( );
            h.put(Attribute.MATLAB_PARAMS, mp);
        }
        // Calculate Simulink's idea of where this module should be located in
        // the sheet for the module's parent, and save the coordinates in the
        // "position" key/value in the "matlab_params" hash table.
        Frame f = m.getUpperFrame( );
        if (f != null) {
            double [ ] nw = f.getAbsoluteNwCorner( );
            double [ ] se = f.getAbsoluteSeCorner( );
            int nwX = (new Double(nw[Frame.X] + 0.5)).intValue( );
            int nwY = (new Double(nw[Frame.Y] + 0.5)).intValue( );
            int seX = (new Double(se[Frame.X] + 0.5)).intValue( );
            int seY = (new Double(se[Frame.Y] + 0.5)).intValue( );
            String pos = "[" + nwX + " " + nwY + " " + seX + " " + seY + "]";
            mp.put(Attribute.POSITION, pos);
        }
        // Copy the Simulink attributes from m into the "matlab_params" table.
        // This approach means that any explicitly specified matlab parameters
        // overwrite those calculated above.
        a = m.getSimulinkAttributes( );
        for (Enumeration e = a.keys( ); e.hasMoreElements( );) {
            String key = (String)e.nextElement( );
            mp.put(key, a.get(key));
        }
```

APPENDIX E-continued

```
        return h;
    }
    /**
     * Generates the .m statements needed to open the parent libraries of a
     * given library element. This member keeps track of which libraries have
     * already been olened so as to avoid generating any more code than is
     * necessary.
     *
     * @param libraryElt Library element whose parent libraries should be opened.
     *
     * @return String of .m instructions needed to open the parent libraries of
     *                a given library element.
     */
    String openParentLibraries(String libraryElt) {
        Vector parentParts = Utility.split('/', libraryElt);
        StringBuffer pathBuf = new StringBuffer( );
        StringBuffer b = new StringBuffer( );
        String sep = " ";
        for (int i = 0; i < parentParts.size( ) - 1; i++) {
            String part = (String)parentParts.elementAt(i);
            pathBuf.append(sep + part);
            String path = pathBuf.toString( );
            sep = "/";
            if (! openLibraries.contains(path))
                b.append(CR + "open_system('" + path + "')");
            openLibraries.add(path);
        }
        return b.toString( );
    }
    /**
     * Returns a string of Matlab set_param( ) instructions. The instructions
     * are built from the key/values in a given hash table.
     *
     * @param name Block name to be used in the set_param( ) instructions.
     * @param h Hash table from which the set_param key/values should be taken.
     *
     * @return String containing Matlab set_param( ) instructions.
     */
    String generateSetParams(String name, Hashtable h) {
        StringBuffer b = new StringBuffer( );
        if (h != null && h.isEmpty( )) {
            b.append(CR + "set_param('" + name + "'");
            for (Enumeration e = h.keys( ); e.hasMoreElements( );) {
                String key = (String)e.nextElement( );
                String value = h.get(key).toString( );
                if (! key.equals(Attribute.PoSITION)) value = "'" + value + "'";
                b.append(", . . . " + CR + " " + "'" + key + "', " + value);
            }
            b.append(");");
        }
        return b.toString( );
    }
    /**
     * Generates the .m instructions needed to create a Sysgen/Simulink block
     * for a given module, then recursively does the same for the modules
     * submodules.
     *
     * @param m Module for which .m block creating code should be produced.
     *
     * @return String of .m instructions needed to create a Sysgen/Simulink
     *                block for a given module and its submodules.
     */
    public String addBlocks(Module m) {
        Hashtable attrs = m.getAttributes( );
        // Build the hash table of key/values to use for this block.
        Hashtable h = buildModuleSettings(m);
        // If m needs a level of hierarchy, then generate one.
        StringBuffer b = new StringBuffer( );
        if (m.getsSchematicSheet( ))
            if (m.isTopLevel( )) {
                b.append(CR + "new_system('" + m.getHierarchicalName( ) + "');");
                b.append(CR + "save_system('" + m.getHierarchicalName( ) + "');");
                b.append(CR + "open('" + m.getHierarchicalName( ) + "');");
```

APPENDIX E-continued

```
            }
            else
                b.append(CR + "add_block('built-in/Subsystem', '" +
                    m.getHierarchicalName( ) + "');");
        else if (m.isLeaf( )) {
            String libraryElt = (String)h.get(Attribute.LIBRARY_ELT_NAME);
            Utility.assert_(libraryElt != null,
                "don't know what library element to use for leaf module");
            b. append(openParentLibraries(libraryElt));
            b.append(CR + "add_block('" + libraryElt + "', '" +
                m.getHierarchicalName( ) + "');");
        }
        // Generate set_param instructions for the block. Note: This
includes
        // setting the Position parameter.
        if (m.getsSchematicSheet( ) || // m.isLeaf( )) {
            b.append(generateSetParams(in.getHierarchicalName( ),
                (Hashtable)h.get(Attribute.MATLAB_PARAMS)));
        }
        // Recursively call this member on all of m's submodules.
        for (Enumeration e = m.getSubmodules( ).elements( );
e.hasMoreElements( );)
            b.append(addBlocks((Module)e.nextElement( )));
        return b.toString( );
    }
    /**
    * Generates the .m instructions needed to create a Sysgen/Simulink
ports
    * for a given module, then recursively does the same for the module's
    * submodules.
    *
    * @param m Module for which .m port creating code should be produced.
    *
    * @return String of .m instructions needed to create a Sysgen/Simulink
    *          ports for a given module and its submodules.
    */
    public String addPorts(Module m) {
        // Write an "add_block" to make each port provided m is a level of
        // hierarchy.
        StringBuffer b = new StringBuffer( );
        if (m.getsSchematicSheet( )) {
            Port [ ] inPorts = new Port [m.getPorts( ).size( ) + 1];
            Port [ ] outPorts = new Port [m.getPorts( ).size( ) + 1];
            int nrInPorts = 0, nrOutPorts = 0;
            for (Enumeration e = m.getPorts( ).elements( ); e.hasMoreElements( );)
{
                Port p = (Port)e.nextElement( );
                if (p.getDirection( ).equals(Port.IN)) {
                    inPorts[p.getIndex( )] = p;
                    nrInPorts++;
                }
                else {
                    outPorts[p.getIndex( )] = p;
                    nrOutPorts++;
                }
            }
            for (int i = 1; i <= nrInPorts; i++) {
                Port p = inPorts[i];
                b.append(openParentLibraries("simulink3/Sources/In1"));
                String name = m.getHierarchicalName( ) + "/" + p.getName( );
                b.append(CR + "add_block('simulink3/Sources/Inl', '" +
                    name + "');");
                Hashtable h = buildPortSettings(p);
                b.append(generateSetParams(name,
                    (Hashtable)h.get(Attribute.MATLAB_PARAMS)));
            }
            for (int i = 1; i <= nrOutPorts; i++) {
                Port p = outPorts[i];
                b.append(openParentLibraries("simulink3/Sinks/Out1"));
                String name = m.getHierarchicalName( ) + "/" + p.getName( );
                b.append(CR + "add_block('simulink3/Sinks/Out1', '" +
                    name + "');");
                Hashtable h = buildPortSettings(p);
                b.append(generateSetParams(name,
                    (Hashtable)h.get(Attribute.MATLAB_PARAMS)));
            }
        }
        // Recursively call this member on all of m's submodules.
        for (Enumeration e = m.getSubmodules( ).elements( );
```

APPENDIX E-continued

```
e.hasMoreElements( );)
        b.append(addPorts((Module)e.nextElement( )));
        return b.toString( );
    }
    /**
     * Generates the .m instructions needed to create a Sysgen/Simulink
lines
     * for a given module, then recursively does the same for the module's
     * submodules.
     *
     * @param m Module for which .m lines creating code should be produced.
     *
     * @return String of .m instructions needed to create the
Sysgen/Simulink
     *              lines for a given module and its submodules.
     */
    public String addLines(Module m) {
        Hashtable attrs = m.getAttributes( );
        StringBuffer b = new StringBuffer( );
        // Write an "add_line" to make each line provided m is a Simulink
        // level of hierarchy.
        if (m.getsSchematicSheet( )) {
            for (Enumeration e = m.getLines( ).elements( ); e.hasMoreElements( );)
{
                Line l = (Line)e.nextElement( );
                Port dp = l.getDriver( );
                Port lp = l.getLoad( );
                b.append(CR + "add_line('" + m.getHierarchicalName( ) + "', '" +
                    dp.getSimulinkName(m) + "', '" + lp.getSimulinkName(m) + "', "
+
                    "'autorouting', 'on');");
            }
        }
        // Recursively call this member on all of m's submodules.
        for (Enumeration e = m.getSubmodules( ).elements( );
e.hasMoreElements( );)
            b.append(addLines((Module)e.nextElement( )));
        return b.toString( );
    }
}
```

What is claimed is:

1. A method for creating a circuit design, comprising:

instantiating a plurality of objects in response to execution of an object-oriented program, the objects having hierarchy attributes, connectivity attributes, and display attributes that describe a plurality of modules, wherein the hierarchy attributes define parent-child relationships between modules, the connectivity attributes define input-output connections between modules, and the display attributes define a layout of the modules for viewing, wherein each of the objects has an associated method for generating a first design specification in a first format, and the plurality of objects include frame-type objects, each frame-type object having attributes that specify a display location of the associated frame, and each child module has at least one frame-type object that specifies a display location of the child module within a frame-type object associated with a parent module of the child module;

generating the first design specification from the plurality of objects; and displaying the modules and logic elements in accordance with the display attributes.

2. The method of claim 1, further comprising:

interpreting the first design specification with a design tool; and generating a second design specification in a second format with the design tool.

3. The method of claim 2, wherein each module having a parent module and one or more children modules has a first frame-type object and a second frame-type object, wherein the first frame-type object has attributes that specify a location within a frame-type object of the parent module, and the second frame-type object is referenced by frame-type objects of the one or more children modules.

4. The method of claim 2, wherein each frame-type object has associated size attributes.

5. The method of claim 4, wherein the size attributes are parameterizable.

6. The method of claim 5, wherein attributes of a frame-type object specify a display location relative to a corner of another frame-type object.

7. The method of claim 1, wherein each module having a parent module and one or more children modules has a first frame-type object and a second frame-type object, wherein the first frame-type object has attributes that specify a location within a frame-type object of the parent module, and the second frame-type object is referenced by frame-type objects of the one or more children modules.

8. The method of claim 1, wherein each frame-type object has associated size attributes.

9. The method of claim 8, wherein the size attributes are parameterizable.

10. The method of claim 9, wherein attributes of a frame-type object specify a display location relative to a corner of another frame-type object.

11. An apparatus for creating a circuit design, comprising:
means for instantiating a plurality of objects in response to execution of an object-oriented program, the objects having hierarchy attributes, connectivity attributes, and display attributes that describe a plurality of modules, wherein the hierarchy attributes define parent-child relationships between modules, the connectivity attributes define input-output connections between modules, and the display attributes define a layout of the modules for viewing, wherein each of the objects has an associated method for generating a first design specification in a first format, and the plurality of objects include frame-type objects, each frame-type object having attributes that specify a display location of the associated frame, and each child module has at least one frame-type object that specifies a display location of the child module within a frame-type object associated with a parent module of the child module;
means for generating the first design specification from the plurality of objects; and
means for displaying the modules and logic elements in accordance with the display attributes.

12. A computing arrangement for creating a circuit design, comprising:
an application program configured to instantiate a plurality of objects, the objects having hierarchy attributes, connectivity attributes, and display attributes that describe a plurality of modules, wherein the hierarchy attributes define parent-child relationships between modules, the connectivity attributes define input-output connections between modules, and the display attributes define a layout of the modules for viewing, wherein each of the objects has an associated method for generating a first design specification in a first format, and the plurality of objects include frame-type objects, each frame-type object having attributes that specify a display location of the associated frame, and each child module has at least one frame-type object that specifies a display location of the child module within a frame- type object associated with a parent module of the child module, the application program further configured to generate the first design specification; and
a design tool coupled to the application program, the design tool configured to interpret the first design specification and display the modules and logic elements in accordance with the display attributes.

13. The computing arrangement of claim 12, wherein the design tool is further configured to generate a second design specification in a second format.

14. The computing arrangement of claim 13, wherein each module having a parent module and one or more children modules has a first frame-type object and a second frame-type object, wherein the first frame-type object has attributes that specify a location within a frame-type object of the parent module, and the second frame-type object is referenced by frame-type objects of the one or more children modules.

15. The computing arrangement of claim 13, wherein each frame-type object has associated size attributes.

16. The computing arrangement of claim 15, wherein the size attributes are parameterizable.

17. The computing arrangement of claim 16, wherein attributes of a frame-type object specify a display location relative to a corner of another frame-type object.

18. The computing arrangement of claim 12, wherein each module having a parent module and one or more children modules has a first frame-type object and a second frame-type object, wherein the first frame-type object has attributes that specify a location within a frame-type object of the parent module, and the second frame-type object is referenced by frame-type objects of the one or more children modules.

19. The computing of claim 18, wherein each frame-type object has associated size attributes.

20. The computing arrangement of claim 19, wherein the size attributes are parameterizable.

21. The computing arrangement of claim 20, wherein attributes of a frame-type object specify a display location relative to a corner of another frame-type object.

22. A method for creating a circuit design, comprising:
instantiating a plurality of objects in response to execution of an object-oriented program, the objects having hierarchy attributes, connectivity attributes, and display attributes that describe a plurality of modules, wherein the hierarchy attributes define parent-child relationships between modules, the connectivity attributes define input-output connections between modules, and the display attributes specify relative positions of the modules for display on a monitor independent of placement information for physical locations of the modules on a semiconductor device, wherein each of the objects has an associated method for generating a first design specification in a first format, and for at least one parent module and at least one child module having a parent-child relationship the display attributes specify a display location of the child module within the parent module;
generating the first design specification from the plurality of objects; and
displaying the modules and logic elements in accordance with the display attributes.

23. The method of claim 22, further comprising:
interpreting the first design specification with a design tool; and
generating a second design specification in a second format with the design tool.

* * * * *